(12) United States Patent
Young

(10) Patent No.: US 10,637,392 B2
(45) Date of Patent: Apr. 28, 2020

(54) PHOTOVOLTAIC DEVICE AND METHOD OF MANUFACTURING THE SAME

(75) Inventor: Edward Willem Albert Young, 's-Gravenhage (NL)

(73) Assignee: Nederlandse Organisatie voor Toegepast-Natuurwetenschappelijk Onderzoek TNO, 's-Gravenhage (NL)

( * ) Notice: Subject to any disclaimer, the term of this patent is extended or adjusted under 35 U.S.C. 154(b) by 1076 days.

(21) Appl. No.: 14/119,468

(22) PCT Filed: May 25, 2012

(86) PCT No.: PCT/NL2012/050370
§ 371 (c)(1),
(2), (4) Date: Dec. 17, 2013

(87) PCT Pub. No.: WO2012/165949
PCT Pub. Date: Dec. 6, 2012

(65) Prior Publication Data
US 2014/0102507 A1    Apr. 17, 2014

(30) Foreign Application Priority Data

May 27, 2011    (EP) .................................. 11167931

(51) Int. Cl.
*H02S 40/00* (2014.01)
*H01L 31/05* (2014.01)
(Continued)

(52) U.S. Cl.
CPC .......... *H02S 40/00* (2013.01); *H01L 31/0504* (2013.01); *H01L 21/67769* (2013.01);
(Continued)

(58) Field of Classification Search
CPC ............... H01L 31/0224; H01L 51/441; H01L 51/0047; H01L 31/0504; H01L 27/301;
(Continued)

(56) References Cited

U.S. PATENT DOCUMENTS 6,278,054 B1 *  8/2001  Ho .................. H01L 31/046
                                                          136/255
2003/0213974 A1  11/2003  Armstrong et al.
(Continued)

FOREIGN PATENT DOCUMENTS

DE    102008050332    4/2010
EP    0 177 300 A2    4/1986
(Continued)

OTHER PUBLICATIONS

Steime et al. Flexible polymer photovoltaic modules with incorporated organic bypass diodes to address module shading effects. Solar Energy Materials & Solar Cells 93 (2009) 1963-1967.
(Continued)

*Primary Examiner* — Michael Y Sun
(74) *Attorney, Agent, or Firm* — BakerHostetler

(57) ABSTRACT

A solar module (and its fabrication method) is presented where a supporting substrate comprises a network of finger traces connected to bus bars. Photo-active layer portions and upper electrode layer portions are deposited on the substrate thereby forming a network of cells. The cells are connected in series by connecting the bus bar of one cell to the upper electrode layer of the adjacent cell, and the bus bars of two adjacent cells are coupled through a bypass element for protecting the cell array.

6 Claims, 13 Drawing Sheets

(51) Int. Cl.
  H02S 40/34 (2014.01)
  H02S 40/30 (2014.01)
  *H01L 31/044* (2014.01)
  *H01L 27/142* (2014.01)
  *H01L 31/0443* (2014.01)
  *H01L 51/44* (2006.01)
  *H01L 31/0224* (2006.01)
  *H01L 21/677* (2006.01)
  *H02S 40/38* (2014.01)
  *H01L 31/053* (2014.01)
  *H01L 31/14* (2006.01)
  *H01L 21/66* (2006.01)
  *H01L 27/118* (2006.01)
  *H01L 27/32* (2006.01)
  *H01L 27/02* (2006.01)

(52) U.S. Cl.
  CPC .............. *H01L 22/34* (2013.01); *H01L 27/02* (2013.01); *H01L 27/142* (2013.01); *H01L 27/1421* (2013.01); *H01L 27/3297* (2013.01); *H01L 31/022433* (2013.01); *H01L 31/044* (2014.12); *H01L 31/0443* (2014.12); *H01L 31/053* (2014.12); *H01L 31/14* (2013.01); *H01L 51/445* (2013.01); *H01L 2027/11881* (2013.01); *H01L 2223/6666* (2013.01); *H02S 40/30* (2014.12); *H02S 40/34* (2014.12); *H02S 40/38* (2014.12)

(58) Field of Classification Search
  CPC ............. H01L 51/0036; H01L 51/4253; H01L 31/022433; H01L 27/02; H01L 27/3297; H01L 2027/11881; H01L 22/34; H01L 31/14; H01L 31/053; H01L 21/67769; H01L 2223/6666; H01L 27/1421; H01L 51/445; H01L 31/0443; H01L 27/142; H01L 31/044; B82Y 10/00; H02S 40/00; H02S 40/30; H02S 40/38; H02S 40/34; Y02P 70/521; Y02E 10/549
  See application file for complete search history.

(56) References Cited

U.S. PATENT DOCUMENTS

| | | |
|---|---|---|
| 2006/0054210 A1 | 3/2006 | Proisy et al. |
| 2007/0089779 A1 | 4/2007 | Balasubramanian et al. |
| 2009/0184746 A1* | 7/2009 | Fahrenbruch ...... H01L 31/02021 327/427 |
| 2010/0108119 A1 | 5/2010 | Gee et al. |
| 2010/0147372 A1 | 6/2010 | Meck |
| 2010/0263719 A1* | 10/2010 | Straub ............... H01L 31/03921 136/256 |
| 2011/0073157 A1* | 3/2011 | Suzuki ................. H05K 5/0226 136/244 |
| 2011/0088764 A1* | 4/2011 | Tsai ................... H01L 31/02167 136/255 |
| 2011/0192441 A1* | 8/2011 | Strehler ............ H01L 31/02008 136/244 |
| 2011/0203654 A1* | 8/2011 | Kihara .................. B82Y 10/00 136/256 |

FOREIGN PATENT DOCUMENTS

| | | |
|---|---|---|
| EP | 1 596 446 A2 | 11/2005 |
| EP | 2 085 986 A1 | 8/2009 |
| EP | 2 226 850 A1 | 9/2010 |
| GB | 2 395 840 A | 6/2004 |
| JP | 2002-536834 | 10/2002 |
| JP | 2010-45402 | 2/2010 |
| TW | 200921756 | 5/2009 |
| WO | 00/46860 A1 | 8/2000 |
| WO | 2004/021455 A1 | 3/2004 |
| WO | 2007/118814 A2 | 10/2007 |
| WO | 2008/030019 A1 | 3/2008 |
| WO | 2009/004560 A2 | 1/2009 |
| WO | 2010/057216 A2 | 5/2010 |
| WO | 2010/064709 A1 | 6/2010 |
| WO | 2010/135801 A1 | 12/2010 |

OTHER PUBLICATIONS

International Search Report, PCT/NL2012/050370, dated May 6, 2013 (3 pages).
International Preliminary Report on Patentability PCT/NL2012/050370, dated Dec. 2, 2013, 5 pages.
Office Action and Search Report with English translation, issued in corresponding Japanese Patent Application No. 101117965, total 1 pages (dated Nov. 24, 2016).

* cited by examiner

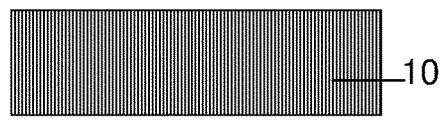
FIG 10A (S101)
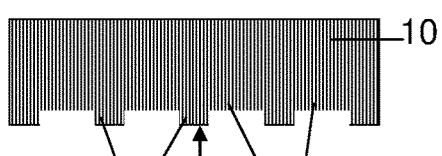
FIG 10B (S102)
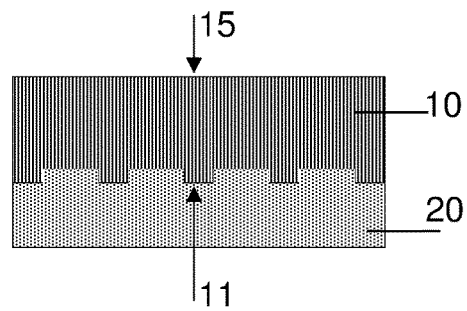
FIG 10C (S103)
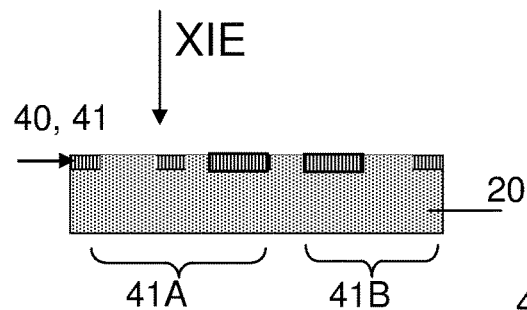
FIG 10D (S104)
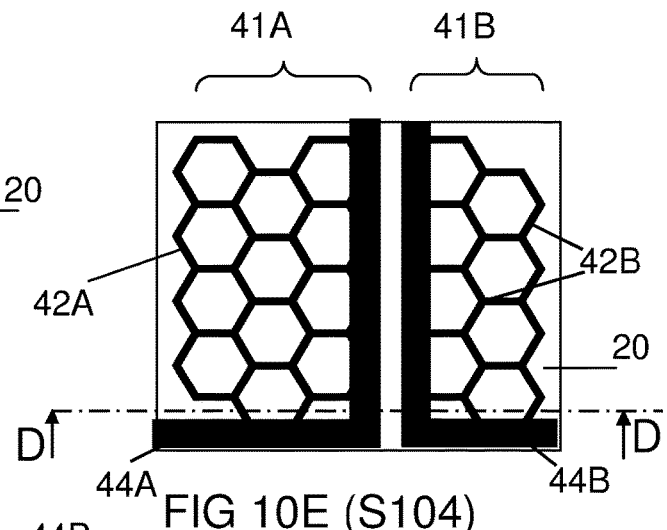
FIG 10E (S104)
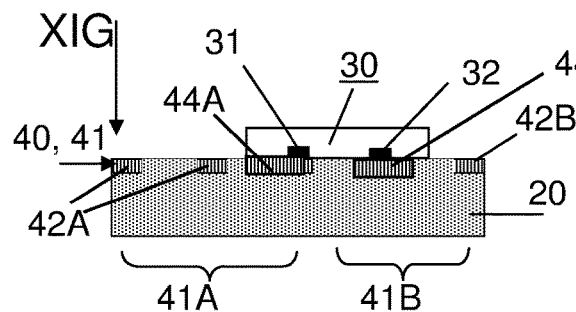
FIG 10F (S2)
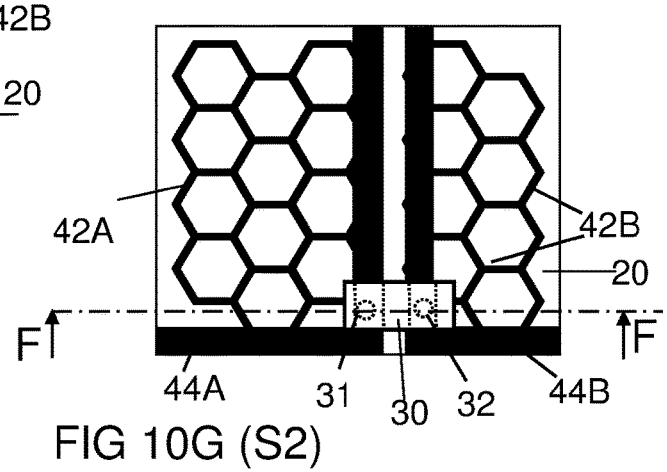
FIG 10G (S2)

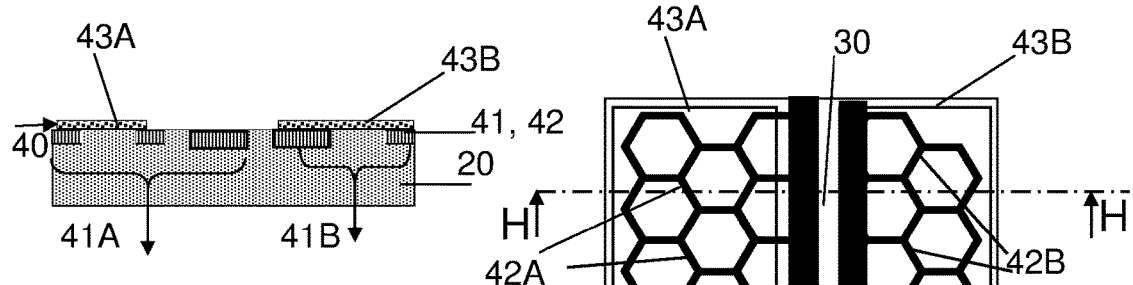
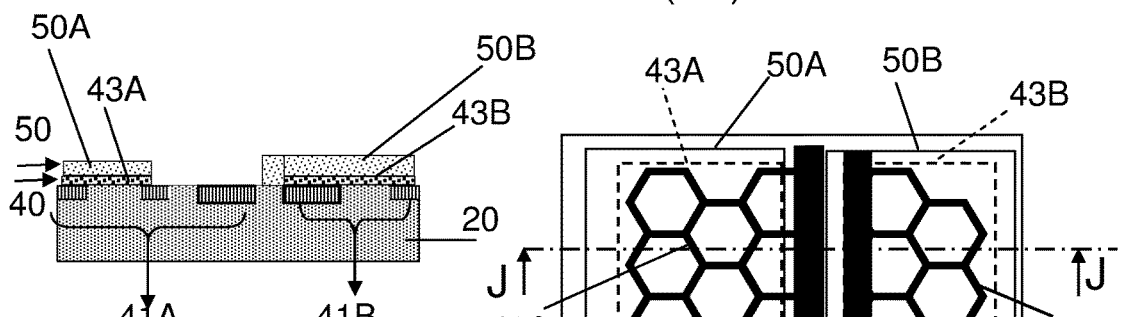
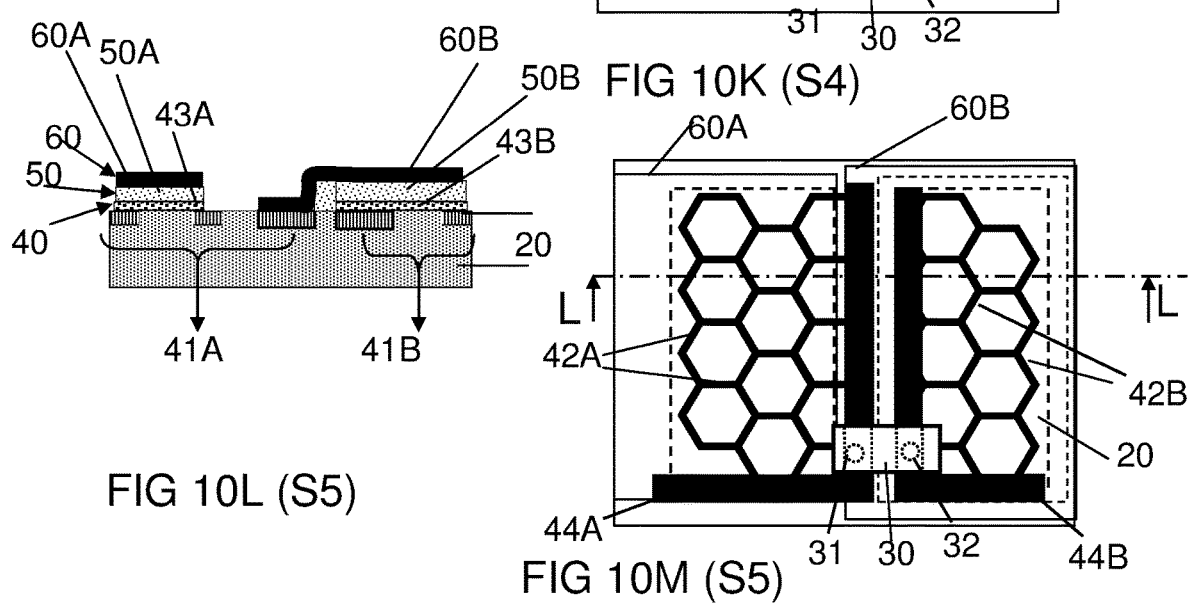

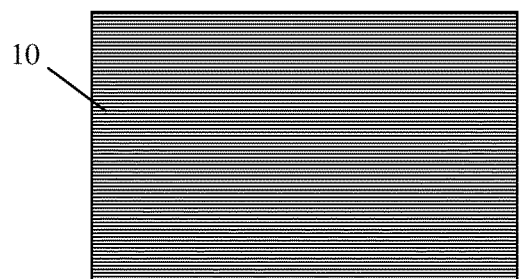
FIG 11A (S111)
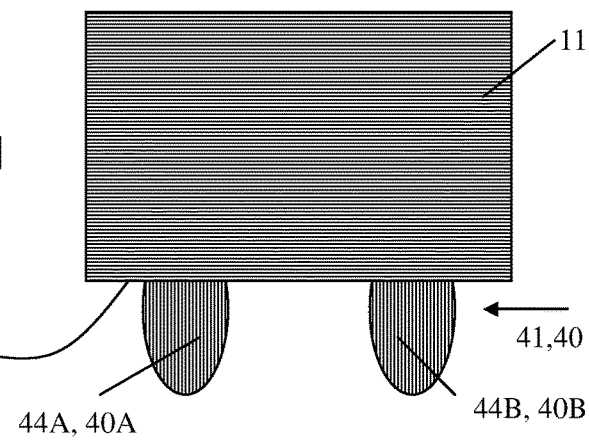
FIG 11B (S112)
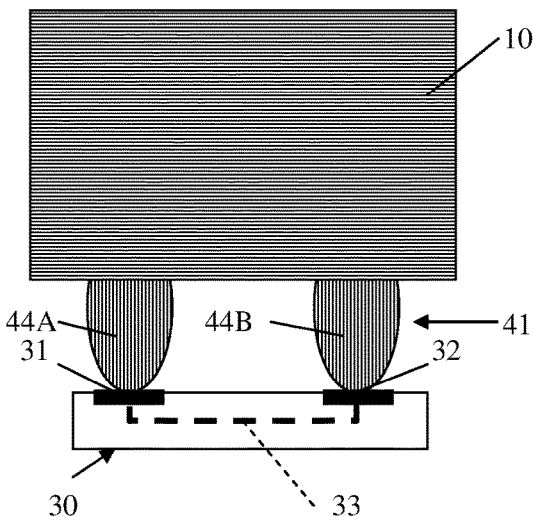
FIG 11C (S2)
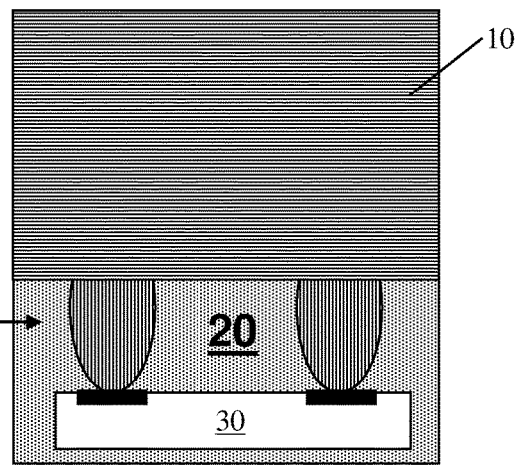
FIG 11D (S113)

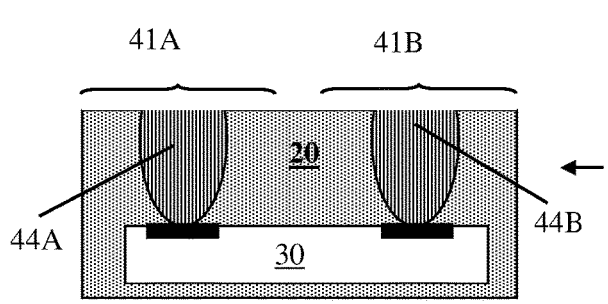
FIG 11E (S114)
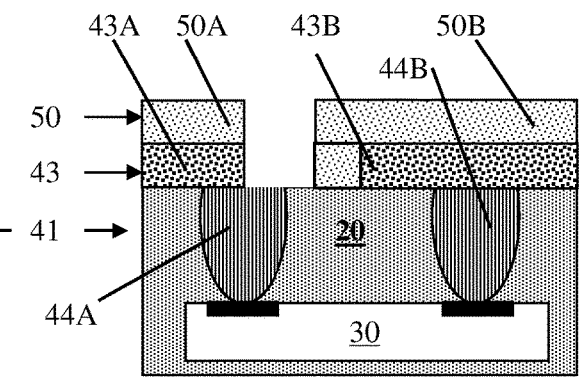
FIG 11F (S3+S4)
40 = 41+ 43;  40A = 41A+43A;  40B=41B+43B
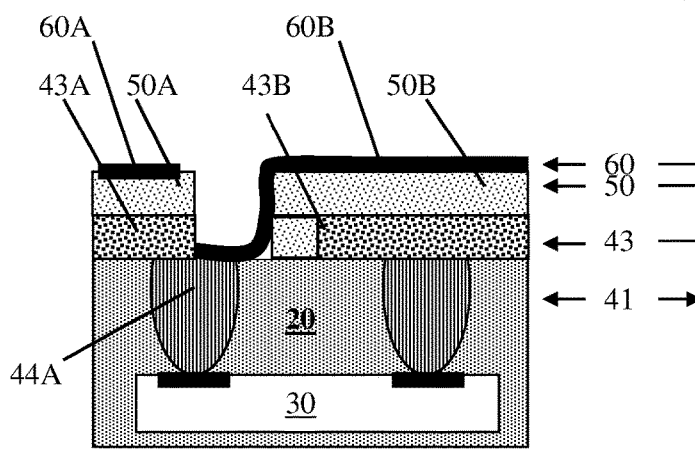
FIG 11G (S5)
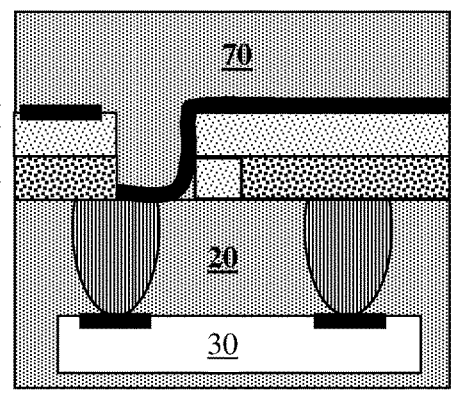
FIG 11H
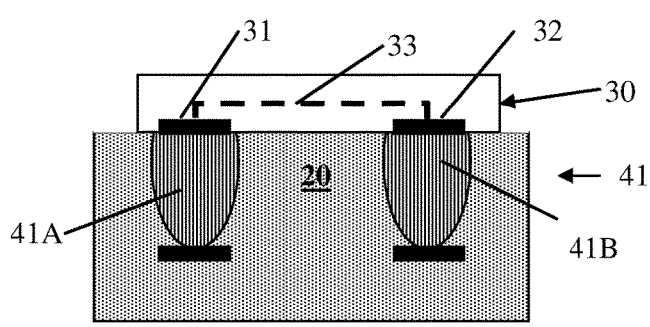
FIG 11I (S2)

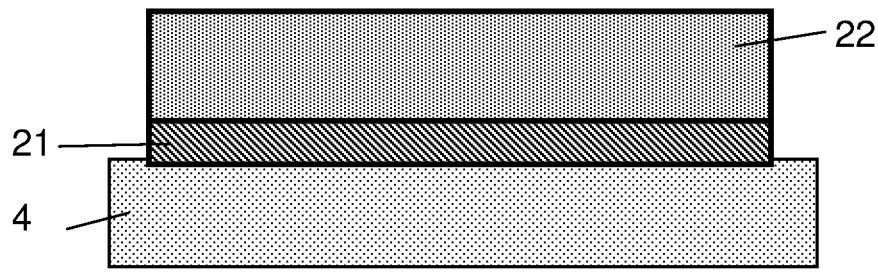
FIG. 12A (S121, S122)
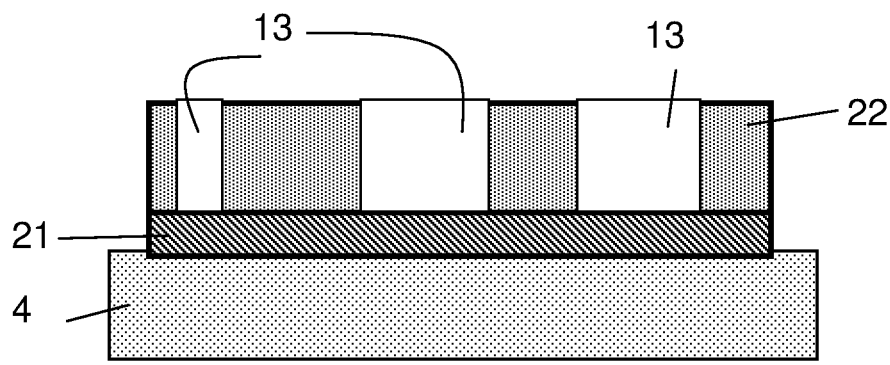
FIG. 12B (S123)
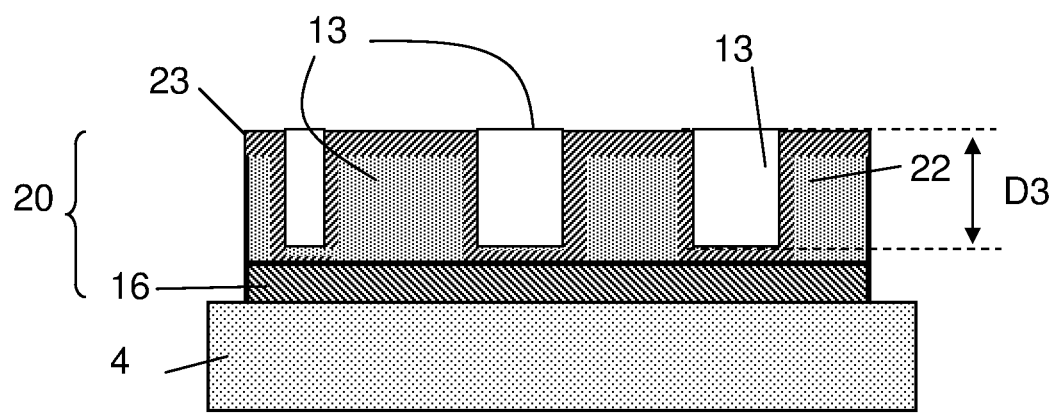
FIG. 12C (S124)

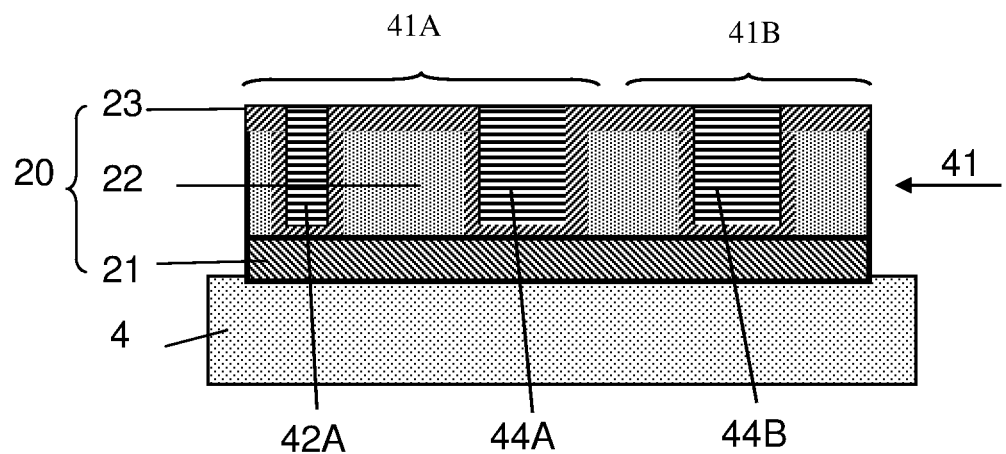
FIG. 12D (S125)
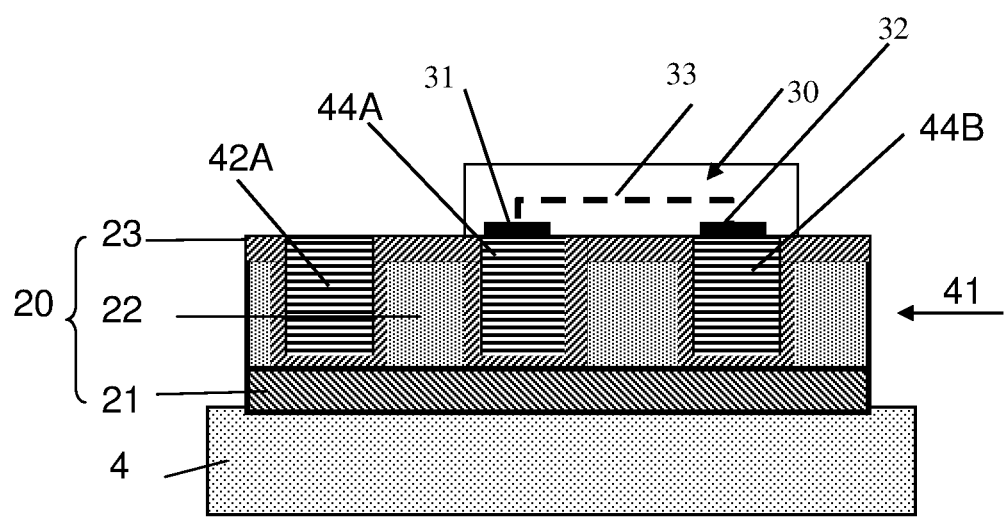
FIG. 12E (S2)

PHOTOVOLTAIC DEVICE AND METHOD OF MANUFACTURING THE SAME

RELATED APPLICATIONS

This application is a National Phase of co-pending PCT/NL2012/050370 filed May 25, 2012, which claims priority to EP 11167931.2 filed May 27, 2011, each of which is expressly incorporated by reference herein in its entirety.

BACKGROUND OF THE INVENTION

Field of the Invention

The present invention relates to a photovoltaic device.

The present invention further relates to a method of manufacturing a photovoltaic device.

Related Art

Most organic photovoltaic (OPV) devices are produced in an electrical series configuration. In this way Ohmic losses in the poor conducting transparent electrode and other current conductors is reduced. However, local shading of the one or more of the cells in this series arrangement (due to tree and chimney shading, bird poop, leaves sticking to the surface of the photo voltaic device etc.) gives rise to severe power losses. The shaded cells, do not conduct current very well. Moreover, the shadowed cell or cells may become reversed biased because of the voltage generated by the unshadowed cells. Reverse biasing of a cell can cause degradation in cell performance or even complete cell failure. A way to overcome this problem is the use of bypass elements such as bypass diodes or more sophisticated bypass circuitry. US2007089779A discloses a system comprising a photovoltaic cell and a diode. The photovoltaic cell comprises a first hole carrier layer, a first hole blocking layer, and a photoactive layer between the first hole carrier layer and the first hole blocking layer. The diode comprises a second hole carrier layer and a second hole blocking layer. Therein the first hole carrier layer is electrically connected with the second hole blocking layer, and the second hole carrier layer is electrically connected with the first hole blocking layer. It is a disadvantage of the known system that it is restricted to a bypass diode as the bypass element.

SUMMARY OF THE INVENTION

According to a first aspect of the present invention a photovoltaic device is provided comprising a stack of layers including a first electrode layer, a second electrode layer, and a photo-active layer arranged between the first electrode layer and the second electrode layer. The first electrode layer comprises an electric support layer. The electric support layer comprises a first structure of electrically conductive electrode lines. The electric support layer comprises a second structure of electrically conductive collector lines that are relatively wide with respect to the electrode lines. More in particular the electrode lines typically have a width in the range of 15 to 150 microns and the collector lines typically have a width of at least 150 microns, for example of 500 microns. The electrode lines and collector lines are arranged in the plane of the electric support layer. The photovoltaic device has a plurality of photovoltaic modules that each comprise a respective lateral portion of the stack of layers. Each lateral portion comprises a first electrode layer portion of the first electrode layer, a second electrode layer portion of the second electrode layer, a photo-active layer portion of the photo-active layer. Each first electrode layer portion comprises a respective electric support layer portion of the electric support layer. The photovoltaic modules are arranged in a series connection wherein mutually subsequent photovoltaic modules are coupled by an electric connection from an electric connection from a collector line (44A) of a first electrode layer portion of a first one of said mutually subsequent photovoltaic modules to a second electrode layer portion of a second one of said mutually subsequent photovoltaic modules. At least one conditional electric bypass element is mounted against the electric support layer. The conditional electric bypass element has a first and a second terminal that are each connected to a respective collector line of mutually different, neighbouring electric support layer portions. The conditional electric bypass element has a conditionally electrically conductive channel between said first and said second terminal. The at least one conditional electric bypass element forms a shunt for at least one of the photovoltaic modules or a set of modules. Preferably each of the photovoltaic modules is provided with a respective conditional electric bypass element.

In the photovoltaic device according to the first aspect of the invention the electric support layer serves both as an electrode and collector for collecting current from the electrode. The collector lines of the electric support layer additionally serve as a connection facility for electrically and mechanically connecting the conditional electric bypass elements. Therewith the photovoltaic device according to the first aspect of the invention can be economically partitioned to a smaller granularity. For example the photovoltaic modules may have a size of a few square cm each. This is advantageous in that it is avoided that large areas of the photovoltaic device have to be bypassed in case only a small portion thereof is dysfunctional.

The arrangement of electrode lines in the plane of the electric support layer may be formed as a grid or mesh, but may alternatively comprise a plurality of mutually parallel lines. The arrangement on the one hand provides for a good transparency, as light can pass unhindered between the electrode lines from the environment to the photo-active layer. Therewith the electrode lines themselves do not need to be transparent, so that a material can be selected therefore that in the first place has a relatively high conductivity, e.g. a metal such as aluminum or copper. If desired an additional transparent electrode layer, may be applied between this electric support layer and the photo-active layer. As the electric support layer already provides for a good lateral electric conduction the requirements for electric conductivity of this additional transparent electrode layer are modest, so that a material can be selected that in the first place has a good transparency. An inorganic layer, such as an indium tin oxide (ITO) layer may be used for this purpose, but alternatively an organic layer, such as a PEDOT layer may be used. Preferably the additional transparent electrode layer has a transparency of at least 50% for a wavelength range for which the photovoltaic device is designed, which is typically the wavelength range of visible radiation. Even more preferably the transparency is at least 90%. The bypass elements can be manufactured in a separate process, and may if required be manufactured according to another technology. For example these bypass elements may be manufactured with a compact, silicon based process.

In an embodiment of the photovoltaic device according to the first aspect the conditional electric bypass element is a diode. However, more preferably the conditional electric bypass element comprises a switching element. A switching element usually has a negligible electrical resistance in its conductive state. The switching element, e.g. a transistor may be controlled by an external signal, but preferably the conditional electric bypass element further comprises a controller for controlling the switching element and that is electrically powered from the first and the second terminal of the bypass element. In this way external control lines to the switching element are obviated. Suitable circuitry for this purpose is known for example from US20090184746A1, US20080198523A1 and DE10200501223B4.

According to a second aspect of the present invention a method of manufacturing a photovoltaic device is provided. In a method according to the second aspect of the invention a first electrode layer at least comprising an electric support layer of an electrically conductive material is provided that comprises a first structure of electrode lines and second structure of collector lines that are relatively wide with respect to the electrode lines. Both the electrode lines and the collector lines are arranged in the plane of the electric support layer. The first electrode layer is partitioned into a plurality of mutually insulated lateral portions.

At least one conditional electric bypass element is mounted at the electric support layer. The conditional electric bypass element has a first and a second electric terminal each in electric contact with a respective collector line of a first and a second mutually neighbouring portion of said electric support layer. The conditional electric bypass element has a conditionally electrically conductive channel between said first and said second terminal.

Optionally additional transparent electrode layer portions of an electrically conducting transparent material are applied on respective lateral portions of the electric support layer structure. The optional step of applying additional electrode layer portions may take place either before or after the step of mounting the at least one conditional electric bypass element.

The method according to the second aspect of the invention further comprises applying respective photo-voltaic layer portions on the first electrode layer portions and subsequently applying respective second electrode layer portions on the photo-voltaic layer portions. Therewith photovoltaic modules are formed each comprising a lateral portion of the first electrode layer including the portion of the electric support layer, comprising the photovoltaic layer and comprising the second electrode layer. Electric connections between each second electrode layer portion and neighboring first electrode layer portion are formed to provide for an electric series connection of the photovoltaic modules. Advantageously these electric connections are formed by applying the second electrode layer portion so that they extend over a free portion of a collector line of their neighboring first electrode layer portion.

BRIEF DESCRIPTION OF THE DRAWINGS

These and other aspects are described in more detail with reference to the drawing. Therein:

FIG. 10A to 10M illustrate a first embodiment of the method in more detail, FIG. 11A-11H illustrate a second embodiment of the method in more detail, FIG. 11I illustrates an alternative for carrying out a step of this second method, FIG. 12A-12E illustrate steps of a third embodiment of the method in more detail.

DETAILED DESCRIPTION OF EMBODIMENTS

Figure 1:
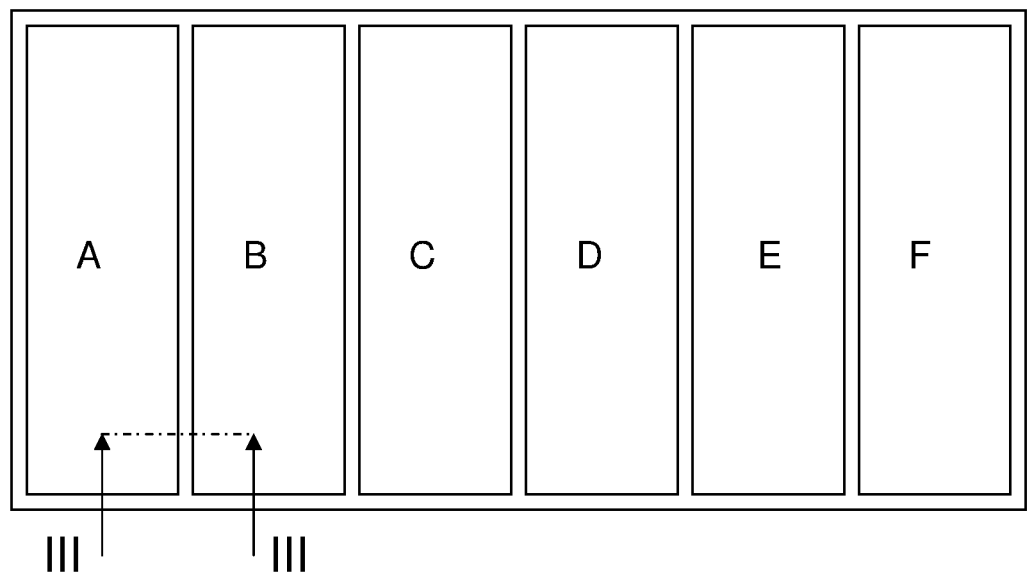
FIG. 1 shows a first embodiment of a photo-voltaic device comprising a plurality of serially arranged photo-voltaic modules.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In case of conflict, the present specification, including definitions, will control. In addition, the materials, methods, and examples are illustrative only and not intended to be limiting.

Like reference symbols in the various drawings indicate like elements.

Figure 2:
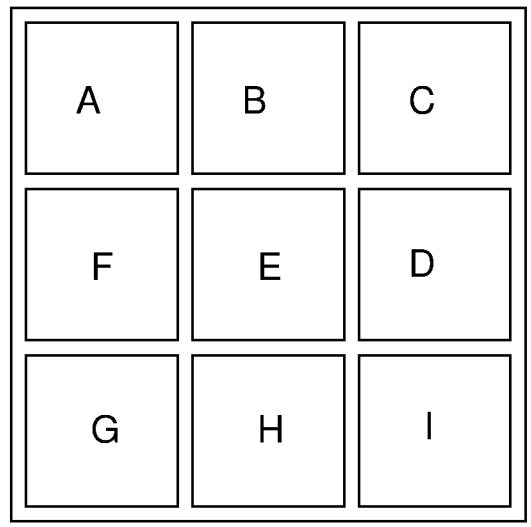
FIG. 2 shows a second embodiment of a photo-voltaic device comprising a plurality of serially arranged photo-voltaic modules.

FIG. 1 schematically shows a photovoltaic device having a plurality of photovoltaic modules A-F. The modules are serially arranged in the alphabetical order indicated in FIG. 1. In this case the photovoltaic modules are rectangular and are arranged in a single row. Subsequent ones of the modules are arranged with their long sides neighboring each other. FIG. 2 shows another embodiment of a photovoltaic device having a plurality of photovoltaic modules A-I, wherein the modules are arranged in a two-dimensional pattern. The modules are electrically serially arranged in the alphabetical order indicated in FIG. 2.

Figure 3:
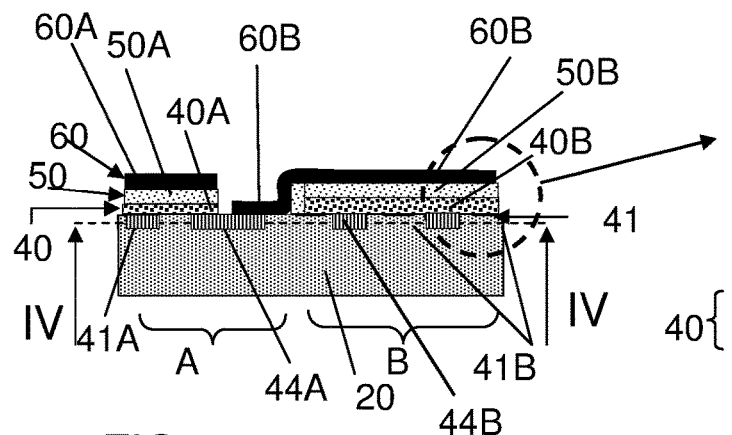
FIG. 3 shows a partial cross-section according to III-III in FIG. 1.
Figure 3A:
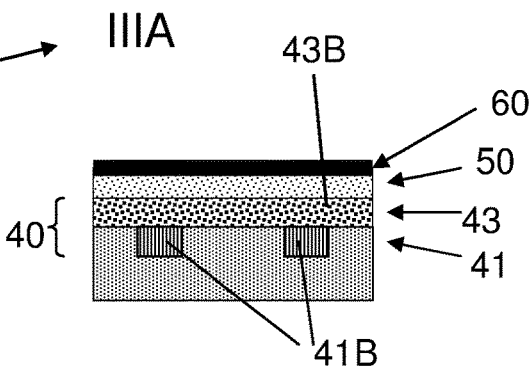
FIG. 3A shows a detail according to MA in FIG. 3.
Figure 4:
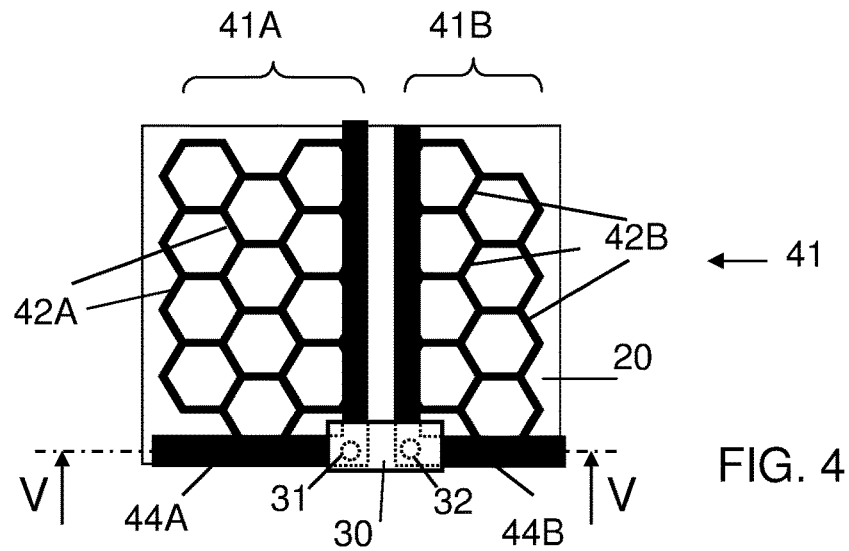
FIG. 4 shows a cross-section according to IV-IV in FIG. 3, FIG. 5 schematically shows a conditional electric bypass element in a cross-section according to V-V of FIG. 4, FIG. 6A-6C show examples of an electric support layer in photo-voltaic devices according to the first aspect of the invention.
Figure 5:
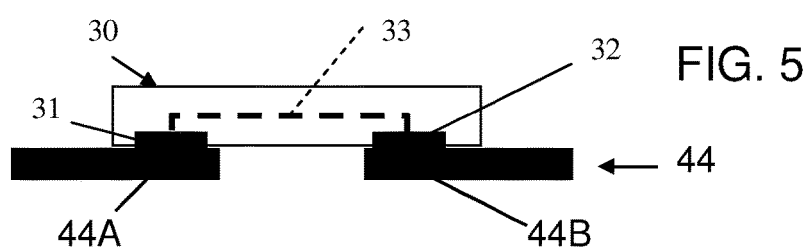

FIG. 3 shows a cross-section according to III-III in FIG. 1. As shown in FIG. 3, the photovoltaic device comprises a stack of layers that includes a first electrode layer 40, a second electrode layer 60, a photo-active layer 50 arranged between the first electrode layer 40 and the second electrode layer 60. Other functional layers may be present between those layers. For example a hole carrier layer may be arranged between the first electrode layer 40 and the photo-active layer 50, and a hole blocking layer may be arranged between the second electrode layer 60 and the photo-active layer 50. The photo-voltaic layer 50 may comprise sub-layers, for example two or more sub-layers that sensible to mutually different wavelength ranges. As shown in FIG. 3A, the first electrode layer 40 comprises an electric support layer 41 as a first sub-layer and additionally a transparent electrode layer 43 as a second sub-layer arranged against the electric support layer 41. FIG. 4 shows a cross-section IV-IV as indicated in FIG. 3 through the electric support layer 41. As shown in FIG. 4 the electric support layer comprises a first structure of electrode lines 42A, 42B here arranged in a hexagonal grid and a second structure (44 as shown in FIG. 5) of electrically conductive collector lines 44A, 44B. The collector lines are relatively wide with respect to said electrode lines. The electrode lines 42A, 42B and the collector lines 44A, 44B are arranged in the plane of the electric support layer 41. The electric support layer 41 can be on the substrate or embedded in an electrically insulating, transparent layer 20 on the substrate or on or in the substrate itself. The transparent electrode layer 43 is arranged at a side of the electric support layer 41 facing the photo-active layer 50. As shown in FIG. 3 the photovoltaic modules A, B each comprise a respective lateral portion of the above-mentioned stack of layers 40, 50, 60. More in particular the lateral portions of the stack comprises a first electrode layer portion 40A, 40B of the first electrode layer 40, a second electrode layer portion 60A, 60B of the second electrode layer 60, and a photo-active layer portion 50A, 50B of the photo-active layer 50. FIG. 3A shows that in this case the first electrode layer portions 40A, 40B each comprise a first sub-layer portion, formed by the respective electric support layer portions 41A, 41B and a second sub-layer portion 43B. As shown in FIG. 3, the photovoltaic modules A, B are arranged in a series connection, in that mutually subsequent photo-voltaic modules A, B are coupled by an electric connection from collector line 44A of a first electric support layer portion 41A of a first one of the mutually subsequent photovoltaic modules A to a second electrode layer portion 60B of a second one B of the mutually subsequent photo-voltaic modules. The wording "transparent" is intended to mean that the layer 20 transmits at least 50% of radiation for a wavelength range for which the photovoltaic device is designed, which is typically the wavelength range of visible radiation. Even more preferably at least 90% of this radiation is transmitted.

Figure 6A:
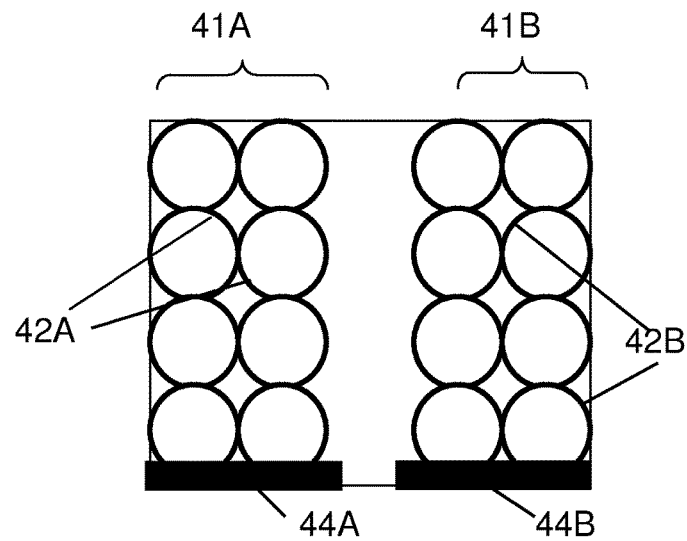
Figure 6B:
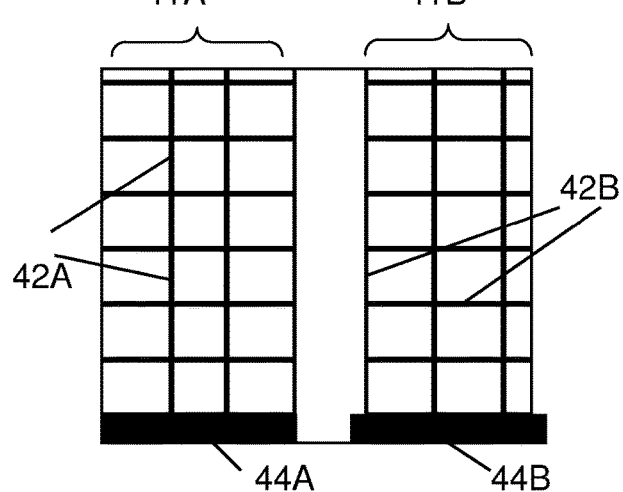
Figure 6C:
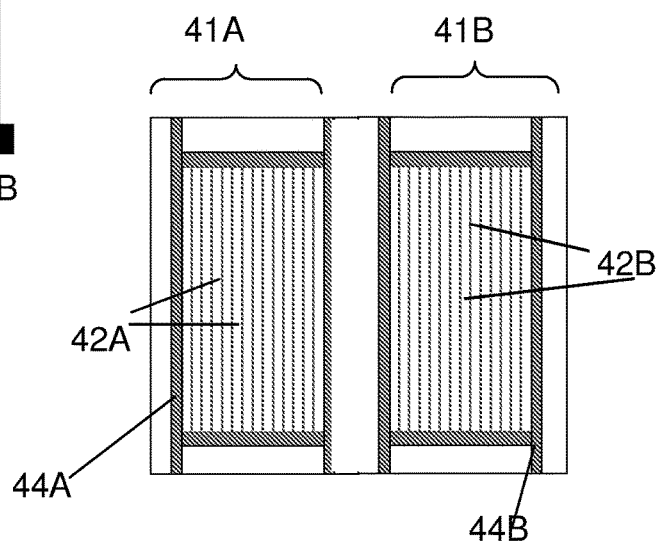

Here the electrode lines 42A, 42B are arranged according to a hexagonal pattern, however various alternative patterns are possible as shown in FIG. 6A-C. At least one conditional electric bypass element 30 is mounted against the electric support layer 41. The conditional electric bypass element 30 has a first and a second terminal 31, 32 that are each connected to a collector line 44A, 44B of a respective one of the neighbouring electric support layer portions 41A, 41B. FIG. 5 shows a cross-section according to V-V in FIG. 4. The conditional electric bypass element 30, shown in more detail in FIG. 5 has a conditionally electrically conductive channel 33 between said first and said second terminal 31, 32. Typically the conditional electric bypass element 30 is formed by a silicon based chip. Various methods are available to the person skilled in the art to provide for a mechanical and electrical connection between the element 30 and the electric support layer 41. For example a direct wire bonding may be provided. Alternatively gold or solder bumps may be used for providing the connections with the electric support layer 41. Instead of directly mounting the conditional electric bypass element 30 on the electric support layer 41, an interposer may be used. The conditional electric bypass element 30 may be mounted on the interposer, for example with bumps, and the interposer can subsequently be connected to the electric support layer 41 by soldering, gluing or crimping.

FIG. 6A shows an alternative arrangement for an electric support layer 41A+B. Therein the electrode lines 42A+B are arranged in circular patterns. FIG. 6B shows an arrangement wherein the electrode lines 42A, 42B are arranged in a rectangular grid. FIG. 6C shows an arrangement wherein the electrode lines 42A, 42B are arranged as a set of parallel lines. As shown in FIG. 6C, the collector lines 44A, 44B may enclose each lateral portion 41A, 41B of the electric support layer 41 therewith obtaining an optimal electrical contact between the first structure of electrode lines 42A, 42B and the second structure of collector lines 44A, 44B respectively. However, alternatively the collector lines may be arranged along a part of the circumference. In an other alternative embodiment the collector lines of an electric support layer portion may be arranged within the structure of the electrode lines. The collector lines 44A, 44B may have a width that is substantially greater than the width of the electrode lines 42.

Suitable materials for use in the various layers in the photovoltaic device are well-known as such, and are for example disclosed in the cited EP patent publication.

Figure 7:
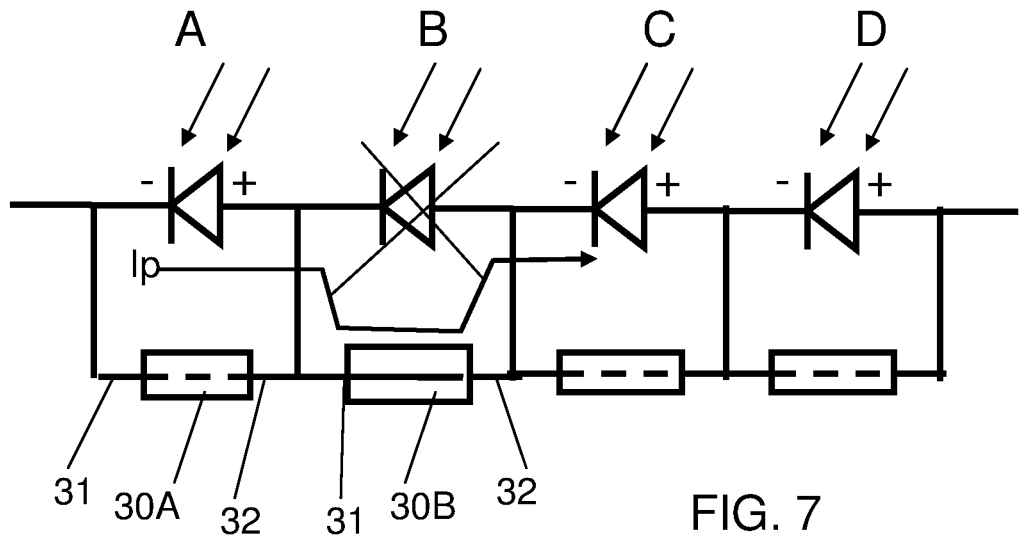
FIG. 7 shows an electronic replacement scheme for a photo-voltaic device according to the first aspect of the invention.
Figure 7A:
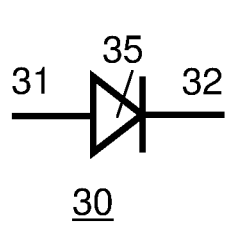
FIG. 7A shows a first example of a conditional electric bypass element.
Figure 7B:
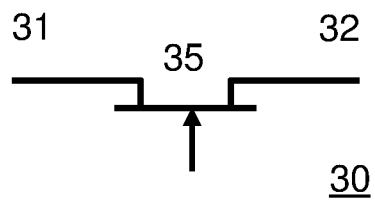
FIG. 7B shows a second example of a conditional electric bypass element.
Figure 7C:
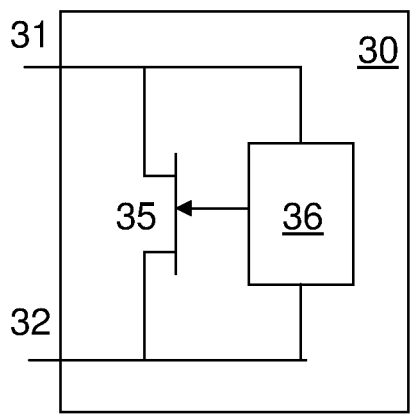
FIG. 7C shows a third example of a conditional electric bypass element.

By way of example FIG. 7 schematically shows an arrangement for a photovoltaic device having four modules A-D, of which module B is not functioning Each of the modules A-D has a conditional electric bypass element 30A-30D. In this case the corresponding conditional electric bypass element 30B becomes electrically conducting, so that the current path Ip is diverted via this bypass element 30B. In an embodiment shown in FIG. 7A of the photovoltaic device according to the first aspect the conditionally electrically conductive channel 35 is a diode that is arranged in a normally blocking direction, i.e. blocking when its corresponding photo-voltaic module properly functions. FIG. 7B shows a second embodiment wherein the conditionally electrically conductive channel 35 is a switching element 35. The switching element may be coupled to an external controller. FIG. 7C shows a still further embodiment, wherein said conditional electric bypass element 30 further comprises a controller 36 for controlling the switching element 35 and that is electrically powered from the first and the second terminal 31, 32 of the bypass element 30. The controller 36 is shown in more detail in FIG. 7D. The controller 36 has a control module 361 and a power supply module 362. The control module 361 controls the switching element 35 dependent on voltages sensed on the terminals 31, 32. The power supply module 362 has inputs coupled to the terminals 31, 32 of the bypass element 30 and provides a regulated voltage supply V to the control module 361. In order to provide the regulated voltage supply the power supply module 362 may use technologies known as such, e.g. rectifier elements such as diodes, storage elements such as a battery or a capacitor. Also more complicated voltage regulation means, such as voltage conversion means, such as a switched mode power supply may be incorporated in this module.

It is not necessary that each photovoltaic module is bridged by a conditional electric bypass element. Alternatively a set of serially arranged photovoltaic modules may be bridged by a conditional electric bypass element. In the embodiment as shown in FIG. 7E a first pair of photovoltaic modules A,B has a conditional electric bypass element 30AB, and a second pair of photovoltaic modules C,D has a conditional electric bypass element 30CD. The photovoltaic modules A-D each have a respective lateral portion 41A, . . . 41D of the electric support layer with electrode lines 42A, . . . 42D and with collector lines 44A, . . . 44D. The pair of serially arranged modules A, B is coupled to a main collector line 44AB, the pair of serially arranged modules C, D is coupled to a main collector line 44CD. FIG. 7F shows the electrical replacement scheme for this arrangement. By way of example a situation is shown wherein photovoltaic module B is dysfunctional. In this case conditional electric bypass element 30AB becomes electrically conducting.

Figure 7D:
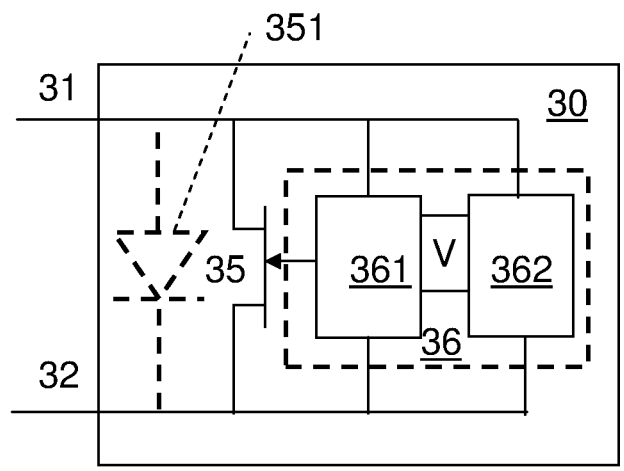
FIG. 7D shows a fourth example of a conditional electric bypass element.
Figure 7E:
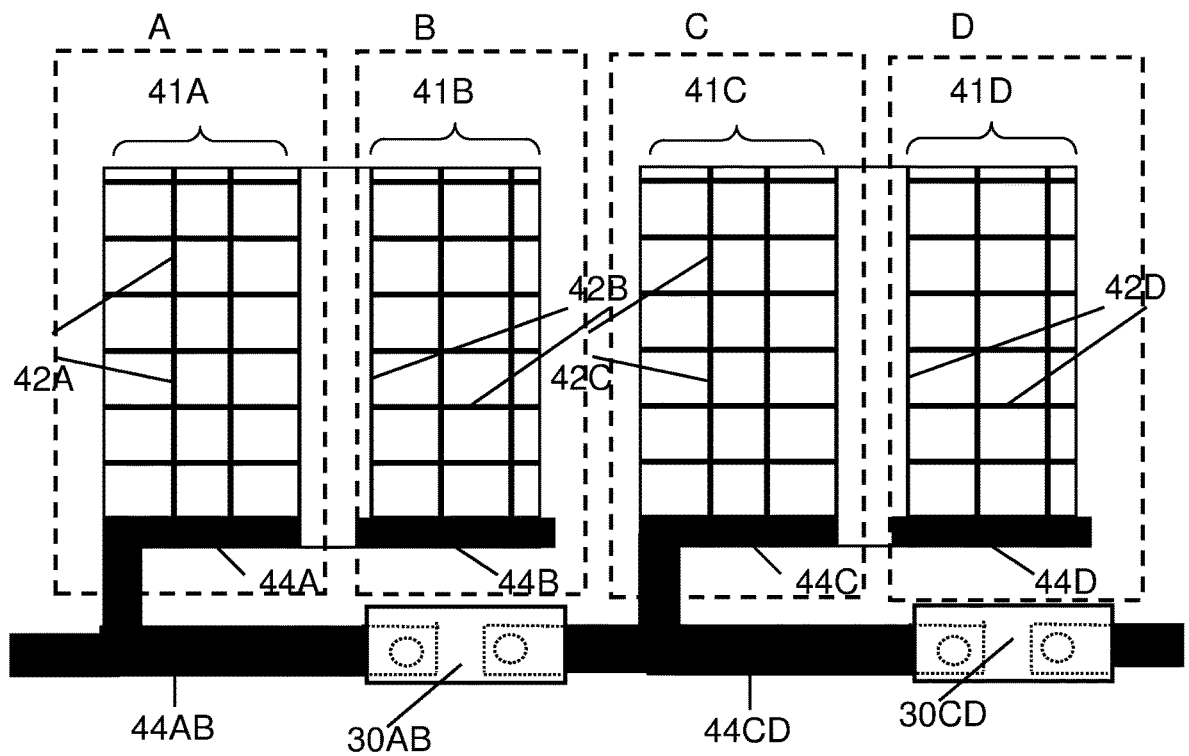
FIG. 7E shows an embodiment wherein a conditional electric bypass element bridges more than one photovoltaic module.
Figure 7F:
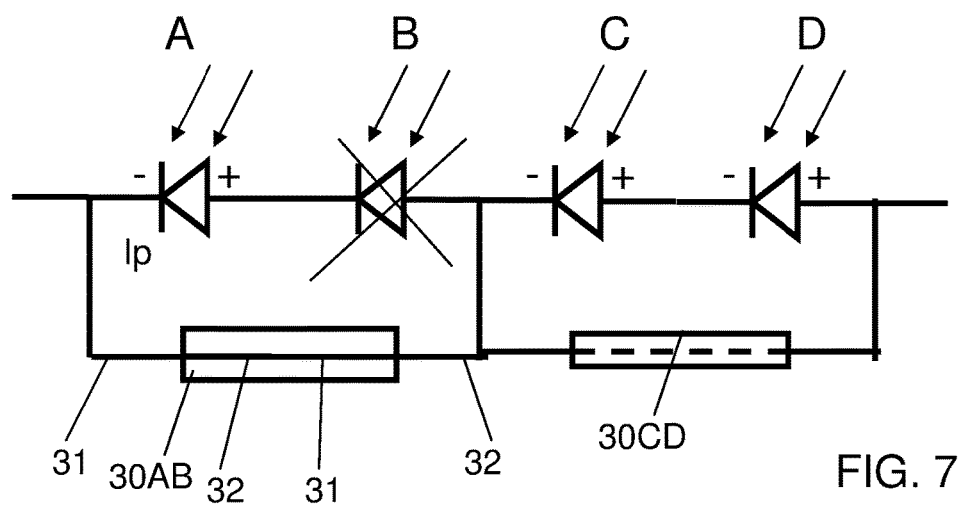
FIG. 7F shows an electronic replacement scheme for this embodiment.
Figure 8:
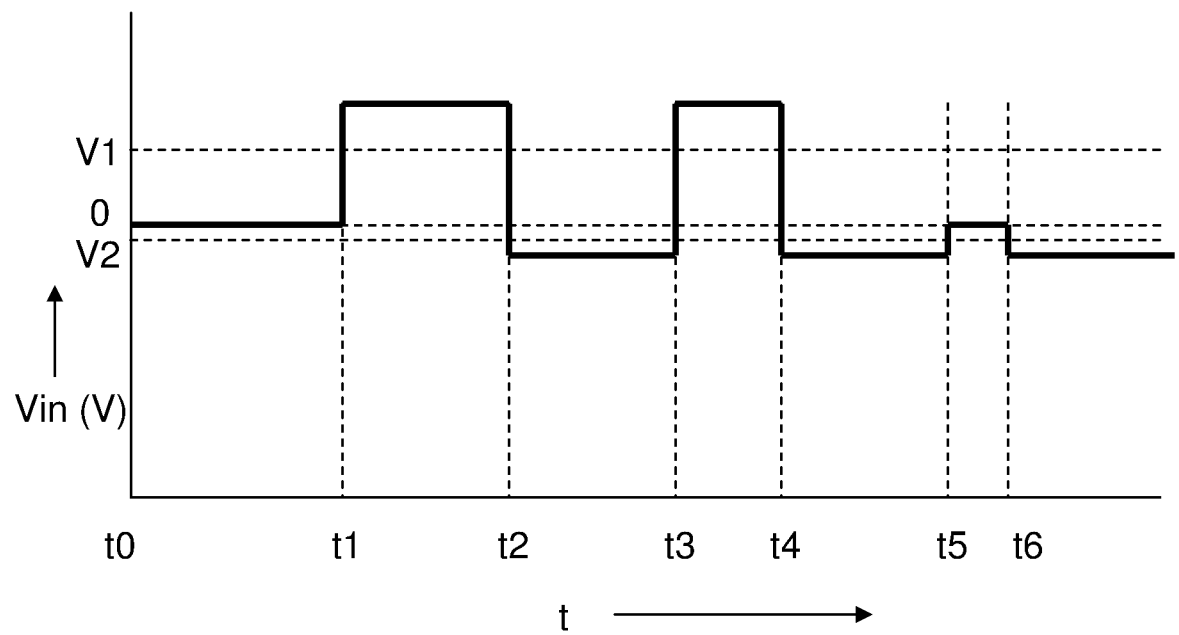
FIG. 8 illustrates operation of a photo-voltaic device according to the present invention comprising a conditional electric bypass element in FIG. 7D.

FIG. 8 illustrates an operation of an embodiment of the photovoltaic device comprising a bypass element 30 as shown in FIG. 7D. During a time period t0 to t1, no input radiation is impingent upon photovoltaic device. Accordingly, the input voltage Vin, i.e. the voltage of terminal 32 relative to terminal 31 is 0V. During a subsequent time period t1-t2 the photovoltaic device receives solar radiation and the photovoltaic module corresponding to the bypass element 30, denoted as monitored photovoltaic module normally functions. Accordingly a positive voltage is generated that exceeds a first threshold voltage V1. The control module 361 responds to this condition by blocking the switching element 35. In a subsequent time period t2 to t3, the monitored photovoltaic module is obscured, e.g. by a shadow of a tree, while other photovoltaic modules in the photo voltaic device function normally. This has the effect that the control module 361 senses a voltage below a second threshold voltage V2. The control module 361 responds to this condition by setting the switching element 35 in a conductive state. Therewith a small rest voltage may remain to enable detection of the prevailing condition of the monitored photovoltaic module. In a subsequent time-period from t3 to t4 the obscuration of the monitored photovoltaic module is cancelled, resulting in a normal functioning of said module. Therewith the voltage Vin observed by the control module 361 again exceeds the first threshold voltage V1, causing the control module 361 to block the switching element 35. In subsequent time period t4 to t5 subsequently the monitored photovoltaic element is obscured, causing the control module 361 to set the switching element 35 in a conductive state. In the time period from t5 to t6 again no input radiation is impingent upon photovoltaic device. Accordingly, the input voltage Vin, i.e. the voltage of terminal 32 relative to terminal 31 is 0V. In this condition the control module 361 typically maintains the switching element 35 in a blocked state.

As a fail save facility the switching element 35 may be bridged by a diode 351.

Figure 9:
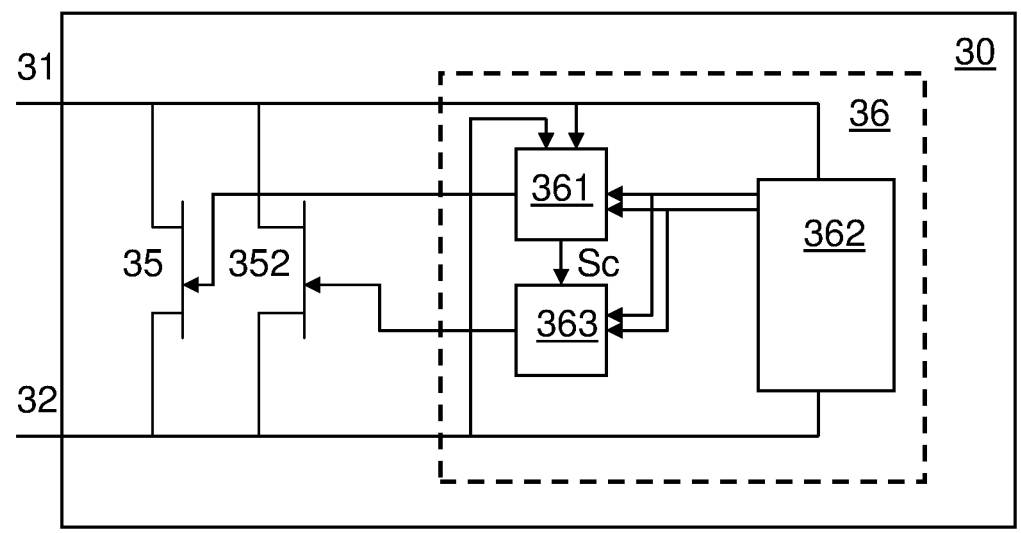
FIG. 9 shows a fifth example of a conditional electric bypass element.

As shown in FIG. 9, the bypass element 30 may comprise an additional bypass channel 352 that is controlled by a second control module 363. The second control module 363 may be coupled to the first control module 361 and receive an input signal Sc indicative for the detected condition. The input signal Sc may indicate one of the following conditions.

A first signal value indicative for a first condition that none of the photovoltaic modules of the photovoltaic device is operational (when no solar radiation is received).

A second signal value indicative for a second condition that the monitored photovoltaic module functions normally.

A third signal value indicative for a third condition that other photovoltaic module function normally but that the monitored photovoltaic module does not functions normally.

The second control module 363 may be provided with means that statistically analyze the occurrence of the various conditions and that dependent on this analysis cause setting the additional bypass channel 352 from a normally blocked state into a permanently conductive state. For example the additional bypass channel 352 may be set into a permanently conductive state if it is detected that the second condition has not been detected since a time exceeding a threshold time interval. During maintenance it may appear the monitored photovoltaic module was only temporarily malfunctioning, e.g. by dirt present on the monitored photovoltaic module. In order to enable resumption of normal operation of the monitored photovoltaic module in this case a tool may be provided that is capable of generating a normally not occurring illumination sequence, for example a light pulse train. The controller 36 may have a reset facility that detects this light sequence. The reset facility may for example be a section in the second control module 363 that detects a rapid alternation between the first and the second condition.

As in the embodiment shown in FIG. 7D a fail save facility may be present.

According to the second aspect of the invention a photovoltaic device according to the first aspect of the invention is manufactured by the following steps.

In a step S1 a first electrode layer is provided that comprises an electric support layer of an electrically conductive material and that comprises a first structure of electrically conductive electrode lines arranged in the plane of said electric support layer. The electric support layer comprises a second structure of collector lines also arranged in the plane of said electric support layer and having a width greater than the width of the electrode lines. The electric support layer comprises a plurality of lateral portions that are mutually isolated from each other.

In a step S2 at least one conditional electric bypass element is mounted at said electric support layer. The conditional electric bypass element has a first electric terminal that is brought into electric contact with a collector line of a first one of a first and a second mutually neighbouring portion of the electric support layer. The conditional electric bypass element has a second electric terminal that is brought into electric contact with a collector line of a second one of the first and the second mutually neighbouring portion of the electric support layer. The conditional electric bypass element has a conditionally electrically conductive channel between said first and said second terminal.

In a step S3 respective first electrode layer portions of an electrically conducting transparent material are applied on said plurality of lateral portions of the electric support layer structure.

In a step S4 respective photo-voltaic layer portions are applied on the first electrode layer portions.

In a step S5 respective second electrode layer portions are applied on the photo-voltaic layer portions. Therewith an electric connection is formed between each second electrode layer portion and a collector line of a neighbouring first electrode layer portion. It is noted that a layer may be formed as a stack of sublayers.

It is not necessary that the steps are carried out in the order presented here. It is alternatively possible that first the photovoltaic cell is manufactured according steps S1, S3, S4 and S5 and that subsequently step S2 is carried out wherein the conditional electric bypass element is mounted at said electric support layer. In another embodiment wherein the at least one conditional bypass element is integrated in a foil below the photovoltaic cell, step S2 may be the first step and followed by steps S1, S3, S4 and S5.

Embodiments of methods according to the second aspect of the invention are now described in more detail.

FIG. 10 shows a first embodiment of a method according to the second aspect. In this embodiment the first step S1 comprises four substeps S101, S102, S103, S104 shown in FIG. 10A-10E.

More in particular the first step S1 of providing a first electrode 40 comprises a first substep S101, shown in FIG. 10A wherein a first, metal substrate 10 is provided.

As shown in FIG. 10B, in a second substep S102 of step S1 a first main surface 11 of the metal substrate is patterned. Therewith protruding 12 and recessed portions 13 are created in said first main surface 11.

As shown in FIG. 10C, in a third substep S103 an electrically insulating, transparent support layer 20 is deposited at the first main surface 11 of the metal substrate 10.

As shown in FIGS. 10D and 10E in a fourth substep S104 material is removed from the metal substrate at a second main surface 15 of the metal substrate opposite its first main surface 11. FIG. 10E shows a top-view according to XIE in FIG. 10D. FIG. 10D is a cross-section according to D-D in FIG. 10E. Therewith the electrically insulating, transparent support layer 20 is revealed where the recessed portions 13 are disappeared due to the removal of material from the metal substrate 10. Therewith an electric support layer 41 is formed that comprises a structure of electrically conductive electrode lines 42A, 42B arranged in the plane of said electric support layer and that is embedded in the electrically insulating, transparent support layer 20. The electric support layer 41 forms an electrode 40. More details of such methods for providing a first electrode 40 are presented in WO2011/016724.

The pattern of protruding 12 and recessed portions 13 is created during the second substep S102 so that the electric support layer 41 comprises a plurality of lateral portions 41A, 41B, that are electrically insulated from each other. I.e. between each two regions that will result in a lateral portion the pattern of protruding 12 and recessed portions 13 is interrupted by a boundary zone having no protruding portions. Each of the electric support layer portions 41A, 41B comprises a first structure with electrode lines 42A, 42B and a second structure with collector lines 44A, 44B. The first structure and the second structure of each electric support layer portion 41A, 41B are electrically connected to each other.

FIG. 10F and FIG. 10G show the second step S2. Therein FIG. 10F is a cross-section and FIG. 10G is a top-view according to XIG in FIG. 10F. FIG. 10F shows a cross-section according to F-F in FIG. 10G. In step S2 the at least one conditional electric bypass element 30 is mounted at said electric support layer 41. As can be seen in FIG. 10F, the first electric terminal 31 of the conditional electric bypass element 30 is brought into electric contact with a collector line 44A of a first one 41A of the mutually neighbouring portions 41A, 41B of the electric support layer 41. The second electric terminal 32 of the conditional electric bypass element 30 is brought into electric contact with a collector line 44B of a second one 41B of the mutually neighbouring portions 41A, 41B of the electric support layer 41.

Steps S3, S4 and S5 are shown in cross-section in FIGS. 10H, 10J and 10L respectively and in top-view in FIG. 10I, 10K, 10M respectively. FIGS. 10H, 10J and 10J are cross-section according to H-H in FIG. 10I, according to J-J in FIG. 10K and according to L-L in FIG. 10M. The direction of the top-views corresponds to the directions defined for the top-views of FIGS. 10E and 10G.

FIGS. 10H and 10I show the result of the third step S3 wherein respective electrically conductive transparent layer portions 43A, 43B of an electrically conducting transparent material, such as indium tin oxide (ITO) or PEDOT are applied on said plurality of lateral portions 41A, 41B of the electric support layer structure 41. Lateral portion 41A of the support layer structure 41 and electrically conductive transparent layer portion 43A together form a lateral portion 40A of the electrode layer 40. Lateral portion 41B of the support layer structure 41 and electrically conductive transparent layer portion 43B together form a lateral portion 40B of the electrode layer 40.

FIGS. 10J and 10K show the result of the fourth step S4 wherein respective photo-voltaic layer portions 50A, 50B are applied on the electrically conductive transparent layer portions 43A, 43B. Alternatively the photo-voltaic layer portions 50A, 50B may be applied directly on the lateral portions 41A, 41B of the electric support layer structure 41.

FIGS. 10L and 10M show the result of the fifth step S5 wherein respective second electrode layer portions 60A, 60B are applied on the photo-voltaic layer portions 50A, 50B. The second electrode layer portion 60B extends beyond its corresponding photo-voltaic layer portion 50B over a collector line 44A of a lateral portion 41A of the support layer 41, which lateral portion 41A is part of the neighbouring first electrode layer portion 40A. Therewith an electric connection is formed between the second electrode layer portion 60B of the second photo-voltaic module B and the first electrode portion 40A of the first photo-voltaic module A. In this case the second electrode layer portion 60B extends directly over the collector line 44A of the lateral portion 41A of the electric support layer structure 41 of module A. Alternatively the electric connection may be formed via an intermediate layer or combination of layers. For example, the electric connection between the second electrode layer portion 60B and the first electrode layer portion 40A may be formed via the transparent layer 43A of that first electrode layer portion 40A. Although for clarity an electrical connection is only shown between one second electrode layer portion 60B and one first electrode layer portion 40A it will be clear that in practice the photovoltaic device may have a larger plurality of photovoltaic modules that are serially arranged in this way, for example as shown in FIG. 1 or 2.

FIG. 11A-11H show a second embodiment of a method according to the second aspect of the invention. In this embodiment the step S1 of providing a first electrode 40 comprising an electric support layer 41 comprising the substeps S111, S112, S113 and S114 as described in more detail below.

According to a first one S111 of these substeps a substrate 10 is provided as shown in FIG. 11A. Any material may be used for this substrate 10 provided that it can be removed relatively easily later in the process, e.g. by etching, solving or peeling. It is further preferable, but not necessary that the material is flexible, so that it can be handled in a roll process. Typically a foil is used having a thickness H in the range of 50 μm to 0.5 mm. The foil is for example a metal foil, such as an aluminum foil or a copper foil.

FIG. 11B shows a second one S112 of these substeps, wherein an electric support layer 41, having electric support layer portions is deposited on a first main side 11 of the substrate. For clarity only the collector lines 44A, 44B of these electric support layer portions are shown. The electric support layer 41 may be deposited in any manner, for example by printing, by a vapor deposition process or by electroplating. The electric support layer 41 forms a first electrode layer 40, with first electrode layer portions 40A, 40B.

The substrate 10 is temporary, in that it is removed S114 after the electric support layer 41 is embedded S113 in a transparent layer 20.

In particular FIG. 11D shows the result of substep S113, wherein the electric support layer 41 is embedded in a transparent layer 20. The substep of embedding in a transparent layer may comprise depositing one or more layers on the electric support layer 41. It is for example possible to deposit a single layer on the electric support layer, e.g. by spin-coating. Alternatively a stack of sub-layers may be deposited as the transparent layer 20. The stack may for example be a barrier stack comprising inorganic layers and organic layers that alternate each other or inorganic layers of a different type that alternate each other. FIG. 11E shows the result of the substep S114, wherein the substrate is removed from transparent layer 20 with the electric support layer 41 embedded therein. In the embodiment shown, the step of mounting S2 (FIG. 11C) the conditional electric bypass element 30 at the electric support layer 41 is carried out after the substep of depositing S112 the electric support layer 41 at a first main side of the substrate 10, and before the substep of embedding S113 the electric support layer 41 in a transparent layer 20.

More details of such methods for providing a first electrode 40 are presented in WO2011/016725.

After the temporary substrate 10 is removed, steps S3 and S4 are carried out. FIG. 11F shows the result of these steps. In step S3 respective mutually separate lateral portions 43A, 43B of a layer of an electrically conducting transparent material are applied on the plurality of lateral portions 41A, 41B of the electric support layer structure 41. In step S4 respective photo-voltaic layer portions 50A, 50B are applied on these lateral portions 43A, 43B of the layer 43. Then, as shown in FIG. 11G respective second electrode layer portions 60A, 60B are applied, step S5, on the photo-voltaic layer portions 50A, 50B. Second electrode layer portion 60B extends beyond its corresponding photo-voltaic layer portions 50B over a free portion of the first electrode layer portion of the neighboring photovoltaic module. In this case second electrode layer portion 60B extends directly over the collector line 44A of the lateral portion 41A of the electric support layer structure 41, so that an electrical connection is formed between the second electrode layer portion 60B and the first electrode layer portion comprising the lateral portion 41A of the neighboring module. In the embodiment of the method shown, a barrier layer 70 is deposited (FIG. 11H). The barrier layer 70 may comprise a stack of sublayers analogously as described for the layer 20.

FIG. 11I shows that alternatively, the step of mounting S2 the at least one conditional electric bypass element 30 at said electric support layer 41 may be carried out after the substep of removing S114 the substrate 10 from the embedded electric support layer structure 41. In that case step S2 may be succeeded by step S3, S4, S5, similarly as shown in FIGS. 11F and 11G.

It is alternatively also possible that the step of mounting S2 the at least one conditional electric bypass element 30 at the electric support layer 41 is postponed until one or more of the steps S3, S4, and S5 are carried out, provided that a free area portion of the electric support layer structure 41 where the conditional electric bypass element 30 can be mounted with its terminals in electrical contact with the electric support layer portion 41A, 41B. Alternatively the electrical contact between the terminals of the conditional electric bypass element 30 and the respective electric support layer portion 41A, 41B may be made via respective transparent electrically conductive layer portions at the electric support layer portions 41A, 41B.

FIG. 12A to 12C show an alternative way of carrying out the step S1 of providing a first electrode 40 having an electric support layer 41. FIG. 12A shows the result of a first and a second substep. The first substep S121 comprises providing a first inorganic layer 21 on a transparent substrate 4. The second substep S122 comprises providing a first organic decoupling layer 22 on the first inorganic layer 21. Subsequently, as shown in FIG. 12B a substep S123 is carried out wherein at least one trench 13 is formed in the organic decoupling layer.

In order to form the at least one trench 13 in the organic decoupling layer for example soft lithography (embossing PDMS rubber stamp into a partially reacted organic layer) may be applied. In this way trenches 13 are formed that can have an aspect ratio of up to 10. The aspect ratio is considered here the dept D3 of the trenches divided by their smallest lateral dimension.

Further the organic decoupling layer is fully cured after imprinting e.g. by polymerization using a heat-treatment or UV-radiation.

The trenches 13 may be treated such that no organics remain in bottom of the trench on top of the first inorganic barrier layer 21. A plasma etch might be used for this cleaning. Remaining organic material could form a diffusion path for moisture.

Subsequently, in substep S124 a second inorganic layer 23 is provided, as shown in FIG. 12C.

An inline vacuum or air based roll-to-roll web coating system known as such may be used to apply the organic 22 and inorganic layers 21, 23. The coating system consists of multiple sections combining an unwind, a rewind and in between a multiple of process chambers dedicated for example to pre-treat a substrate surface, or coat a substrate surface with an inorganic layer, or coat a substrate surface with an organic layer, or coat a substrate surface with a patterned organic layer, or cure an organic coated surface.

The inorganic layers 21, 23 may be applied by all kinds of physical vapor deposition methods such as thermal evaporation, e-beam evaporation, sputtering, magnetron sputtering, reactive sputtering, reactive evaporation, etc. and all kinds of chemical vapor deposition methods such as thermal chemical vapor deposition (CVD), photo assisted chemical vapor deposition (PACVD), plasma enhanced chemical vapor deposition (PECVD), etc.

The organic layers 22 may be applied by all kinds of coatings techniques, such spin coating, slot-die coating, kiss-coating, hot-melt coating, spray coating, etc. and all kinds of printing techniques, such as inkjet printing, gravure printing, flexographic printing, screen printing, rotary screen printing, etc.

After deposition of the second inorganic layer 23 substep S125 is carried out wherein an electrically conductive material is deposited in the at least one trench 13, as shown in FIG. 12D. The electrically conductive material forms an electric support layer structure 41 having electric support layer portions 41A, 41B. In case the at least one trench 13 is formed by a single trench mutually disconnected electric support layer portions 41A, 41B may be formed by depositing the electrically conductive material in respective portions of the single trench. Alternatively separate trenches may be provided for each of the electric support layer portions 41A, 41B to be formed.

To mitigate that the conductive material spreads out at the surface, the top surface is made hydrophobic and the trenches are made hydrophilic. The trenches 13 (see FIG. 12B) may be filled in a single step, for example by sputtering, or by vapor deposition, such as MOCVD, and combining this with the step of polishing or etching. Preferably the trenches 13 are filled with a two-stage process. For example the trenches 13 can be filled with an evaporated metal (e.g. Al as described in EP 1 693 481 A1) or with solution based metals (e.g. Ag, Au, Cu) and an extra baking step (below 150 C). The next process is to fill completely the trenches 13 in order to compensate for shrinkage of the material in the trenches. The electrically conductive material applied during the second step may be the same, but may alternatively be a different material. The metals Ag, Au, and Cu for example have a high reflectivity and therewith preferred as the second electrically conductive material. During this process attention should be paid to the structure design such that the contact area for an electrically conductive layer of a functional component that is to be assembled with the electrical transport component does not come in direct contact with another conductive layer of the functional component, in order to prevent shortcuts. In an alternative method the electrically conductive material is applied in a single step.

More details of such methods for providing a first electrode 40 are presented in WO2010/016763.

Figure 13:
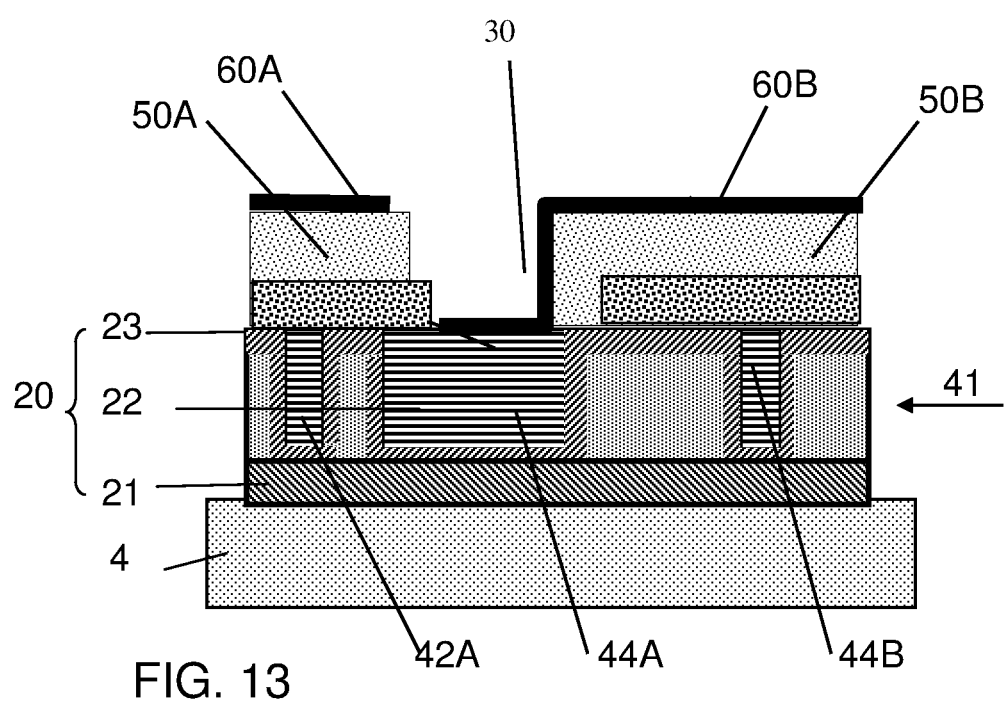
FIG. 13 shows an example of a photo-voltaic device obtainable with this method.

Next the at least one conditional electric bypass element 30 is mounted (S2) at the electric support layer as shown in FIG. 12E. Subsequently, steps S3 to S5 may be performed analogously as was described with reference to FIG. 10J to FIG. 10M, therewith obtaining a photovoltaic device according to the first aspect of the invention, as shown in FIG. 13.

Alternatively, the photo-voltaic device may be completed according to a different procedure. For example, the photoactive layer portions 50A, 50B may be directly applied at the electric support layer portions 41A, 41B.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The invention claimed is:
1. A photovoltaic device comprising:
 a stack of layers including:
  a first electrode layer,
  a second electrode layer, and a photovoltaic layer arranged between the first electrode layer and the second electrode layer, wherein the first electrode layer at least comprising an electric support layer with an electrode line structure of electrically conductive electrode lines and with a collector line structure of electrically conductive collector lines that are wider than said electrode lines, said electrode lines and said collector lines being arranged in the plane of the electric support layer; and at least a first photovoltaic module and a second photovoltaic module, said first photovoltaic module comprising a first lateral portion of said stack of layers and said second photovoltaic module comprising a second lateral portion of said stack of layers, said first lateral portion and said second lateral portion being arranged laterally with respect to each other, wherein the first lateral portion comprises a first portion of the first electrode layer, a first portion of the electric support layer, a first portion of the second electrode layer, and a first portion of the photovoltaic layer, wherein the second lateral portion comprises a second portion of the first electrode layer, a second portion of the electric support layer, a second portion of the second electrode layer, and a second portion of the photovoltaic layer, wherein said first portion of the electric support layer has a first portion of the electrode line structure of electrically conductive electrode lines and a first portion of the collector line structure of electrically conductive collector lines electrically connected to said first portion of the electrode line structure, wherein said second portion of the electric support layer has a second portion of the electrode line structure and a second portion of the collector line structure electrically connected to said second portion of the electrode line structure, the at least first and second photovoltaic modules being arranged in a series connection, wherein at least the first and second photovoltaic modules are coupled by an electric connection from a collector line of the first portion of the collector line structure to the second portion of the second electrode layer so that the second portion of the second electrode layer extends beyond its corresponding second portion of the photovoltaic layer over said collector line of said first portion of the collector line structure, wherein either A) a direct electrical connection is formed between said second portion of the second electrode layer and said collector line of said first portion of the collector line structure, or B) said second portion of the second electrode layer extends beyond its corresponding second portion of the photovoltaic layer over one or more intermediate layers over the first portion of the first electrode layer to form an indirect electrical connection between said second portion of the second electrode layer and said collector line of said first portion of the collector line structure via said one or more intermediate layers, and wherein at least one conditional electric bypass element is mounted against the electric support layer, said conditional electric bypass element having a first terminal and a second terminal with said first terminal being directly connected to a collector line of said first portion of the collector line structure and said second terminal being directly connected to a collector line of said second portion of the collector line structure, said conditional electric bypass element having a conditionally electrically conductive channel between said first terminal and said second terminal.

2. The photovoltaic device according to claim 1, wherein said conditionally electrically conductive channel is a diode.

3. The photovoltaic device according to claim 1, wherein said conditionally electrically conductive channel is a switching element.

4. The photovoltaic device according to claim 3, wherein said conditional electric bypass element further comprises a controller for controlling the switching element that is electrically powered from the first and the second terminals of the conditional electric bypass element.

5. The photovoltaic device according to claim 4, wherein said controller comprises a control module and a power supply module, wherein the control module controls the switching element dependent on voltages sensed on the first and second terminals, and wherein the power supply module provides a regulated voltage supply from an input voltage present on the first and second terminals of the conditional electric bypass element.

6. The photovoltaic device according to claim 5, wherein the power supply module comprises one or more of a rectifier element, a storage element, and a voltage conversion element.

* * * * *